US007696792B2

(12) United States Patent
Hsu

(10) Patent No.: US 7,696,792 B2
(45) Date of Patent: Apr. 13, 2010

(54) TRACK AND HOLD CIRCUIT

(75) Inventor: Cheng-Chung Hsu, Chang-Hua Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 46 days.

(21) Appl. No.: 11/951,319

(22) Filed: Dec. 5, 2007

(65) Prior Publication Data

US 2008/0150590 A1     Jun. 26, 2008

(30) Foreign Application Priority Data

Dec. 6, 2006    (TW) .............................. 95145473 A

(51) Int. Cl.
*H03K 5/00*    (2006.01)
(52) U.S. Cl. .............................. 327/94; 327/91; 327/93; 327/427
(58) Field of Classification Search .................. 327/91, 327/93, 94, 427, 431, 434, 436
See application file for complete search history.

(56) References Cited

U.S. PATENT DOCUMENTS 4,518,926 A * 5/1985 Swanson ..................... 330/253

6,313,819 B1 * 11/2001 Maekawa et al. ............. 345/92
7,019,580 B1 * 3/2006 Michalski ................... 327/427

OTHER PUBLICATIONS

Xicheng Jiang, Zhengyu Wang, M. Frank Chang, A 2GS/s 6b ADC in 0.18um CMOS, IEEE International Solid-State Circuits Conference, 2003, p. 1-3.
Kh. Hadidi and A. Khoei, A Highly Linear Cascode-Driver CMOS Source-Follower Buffer, ICECS, 1996, p. 1243-1246.

* cited by examiner

*Primary Examiner*—Long Nguyen
(74) *Attorney, Agent, or Firm*—Thomas, Kayden, Horstemeyer & Risley

(57) ABSTRACT

A track and hold circuit is disclosed, including: a source follower coupled to a voltage supply; a MOS transistor with well structure, the MOS transistor having a gate terminal coupled to a gate terminal of the source follower, a drain terminal coupled to its body terminal and a source terminal of the source follower, and a source terminal coupled to a current source and an output terminal; a capacitive device having a terminal coupled to the gate terminal of the MOS transistor and another terminal coupled to a fixed voltage level; and a switch device coupled and disposed between an input signal and the gate terminal of the MOS transistor, wherein the switch device is controlled by a control signal.

20 Claims, 4 Drawing Sheets

TRACK AND HOLD CIRCUIT

BACKGROUND OF THE INVENTION

1. Field of the Invention

The present invention relates to a track and hold circuit scheme, and more particularly, to a high-speed open-loop track and hold circuit with high linearity.

2. Description of the Prior Art

In an analog-to-digital converter (ADC), a high-speed track and hold circuit is one of the essential elements. The high-speed track and hold circuit in the prior art is realized by an open-loop scheme. Please refer to FIG. 1. FIG. 1 shows a diagram of a track and hold circuit 100 of a conventional open-loop scheme. As shown in FIG. 1, the track and hold circuit 100 is composed of a sampling network (which comprises a switch 110 and a capacitor 120), a source follower 130, and a current source 140. When the switch device 110 is turned on, the output voltage Vo will track the input voltage Vi, and when the switch device 110 is turned off, the input voltage Vi at that instance will be stored in the capacitor 120. After a settling time period, the output voltage Vo will catch up with the voltage value stored in the capacitor 120, and then remain unchanged. Although this scheme exhibits high-speed properties, the linearity of the transfer function of the source follower 130 will be adversely affected by the body effect and the channel length modulation effect, and consequently performance will decline significantly.

Please refer to FIG. 2. FIG. 2 shows a diagram of a track and hold circuit 200 of another conventional open-loop scheme. In the track and hold circuit 200, the source follower 230 is implemented using a MOS transistor with a well structure, such as an NMOS transistor with a deep N well structure, or a PMOS transistor with an N well structure. As shown in FIG. 2, the source follower 230 has a body terminal coupled to its source terminal and a current source 240, so as to eliminate the above-mentioned body effect. However, there will be parasitic capacitance generated at the PN junction, and the tracking speed of the track and hold circuit 200 will be reduced due to the existence of the parasitic capacitance loading. In addition, the linearity of the source follower 230 in the track and hold circuit 200 will also be affected by the channel length modulation effect and performance will decline greatly.

SUMMARY OF THE INVENTION

It is therefore one of the objectives of the present invention to provide a high-speed track and hold circuit with high linearity, to solve the above problems.

According to an embodiment of a track and hold circuit provided in the present invention, the track and hold circuit includes: a source follower, coupled to a voltage supply; a MOS transistor, having a gate terminal coupled to a gate terminal of the source follower, a drain terminal coupled to its body terminal and a source terminal of the source follower, and a source terminal coupled to a current source and an output terminal; a capacitive device, having a terminal coupled to the gate terminal of the MOS transistor and another terminal coupled to a fixed voltage level; and a switch device, coupled between an input signal and the gate terminal of the MOS transistor, and controlled by a control signal.

According to another embodiment of a track and hold circuit provided in the present invention, the track and hold circuit includes: a first NMOS transistor with a deep N well structure, having a drain terminal coupled to its body terminal and a source terminal coupled to a current source and an output terminal; a second NMOS transistor, having a drain terminal coupled to a voltage supply, a gate terminal coupled to a gate terminal of the first NMOS transistor, and a source terminal coupled to the drain terminal of the first NMOS transistor; a capacitive device, having a terminal coupled to the gate terminal of the first NMOS transistor and another terminal coupled to a fixed voltage level; and a switch device, coupled between an input signal and the gate terminal of the first NMOS transistor, and controlled by a control signal; wherein a threshold voltage of the second NMOS transistor is lower than a threshold voltage of the first NMOS transistor.

According to yet another embodiment of a track and hold circuit provided in the present invention, the track and hold circuit includes: a first PMOS transistor with a N well structure, having a drain terminal coupled to its body terminal and a source terminal coupled to a current source and an output terminal; a second PMOS transistor, having a drain terminal coupled to a voltage supply, a gate terminal coupled to a gate terminal of the first NMOS transistor, and a source terminal coupled to the drain terminal of the first PMOS transistor; a capacitive device, having a terminal coupled to the gate terminal of the first PMOS transistor and another terminal coupled to a fixed voltage level; and a switch device, coupled between an input signal and the gate terminal of the first PMOS transistor, and controlled by a control signal; wherein a threshold voltage of the second PMOS transistor is higher than a threshold voltage of the first PMOS transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
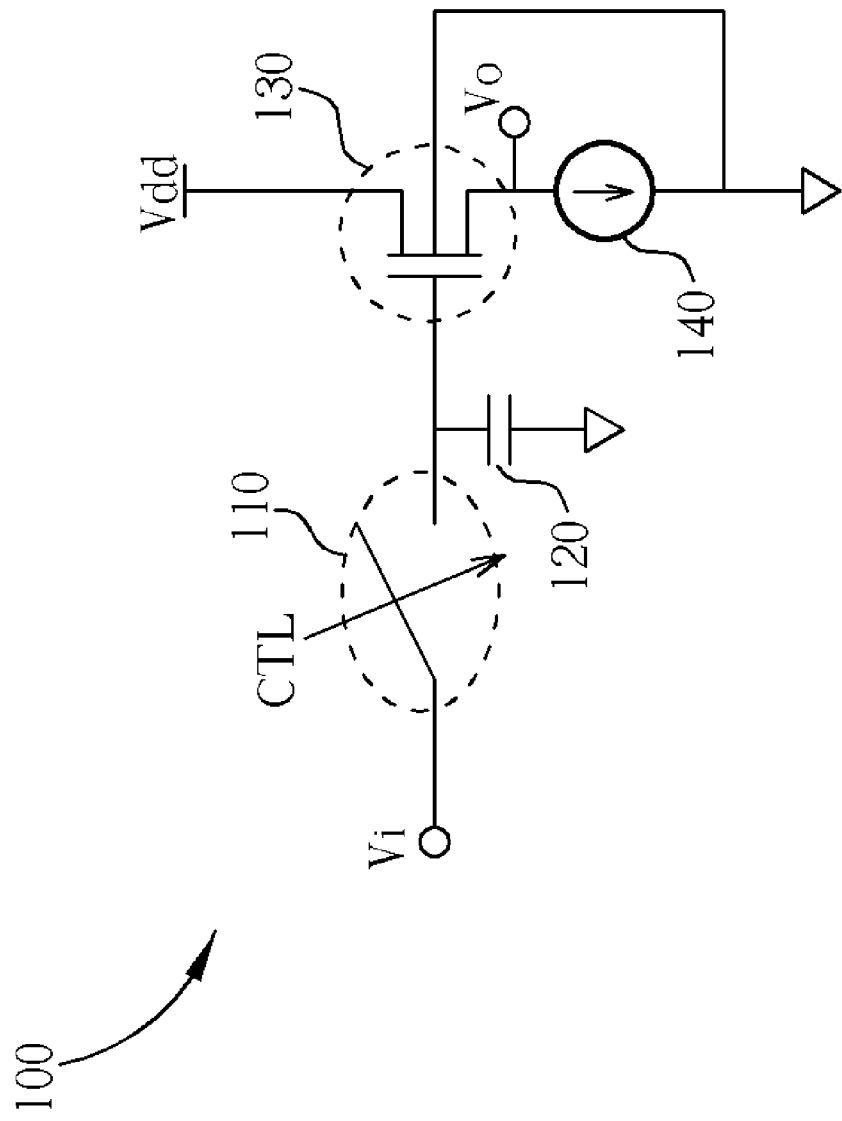
FIG. 1 shows a diagram of a track and hold circuit of a conventional open-loop scheme.
Figure 2:
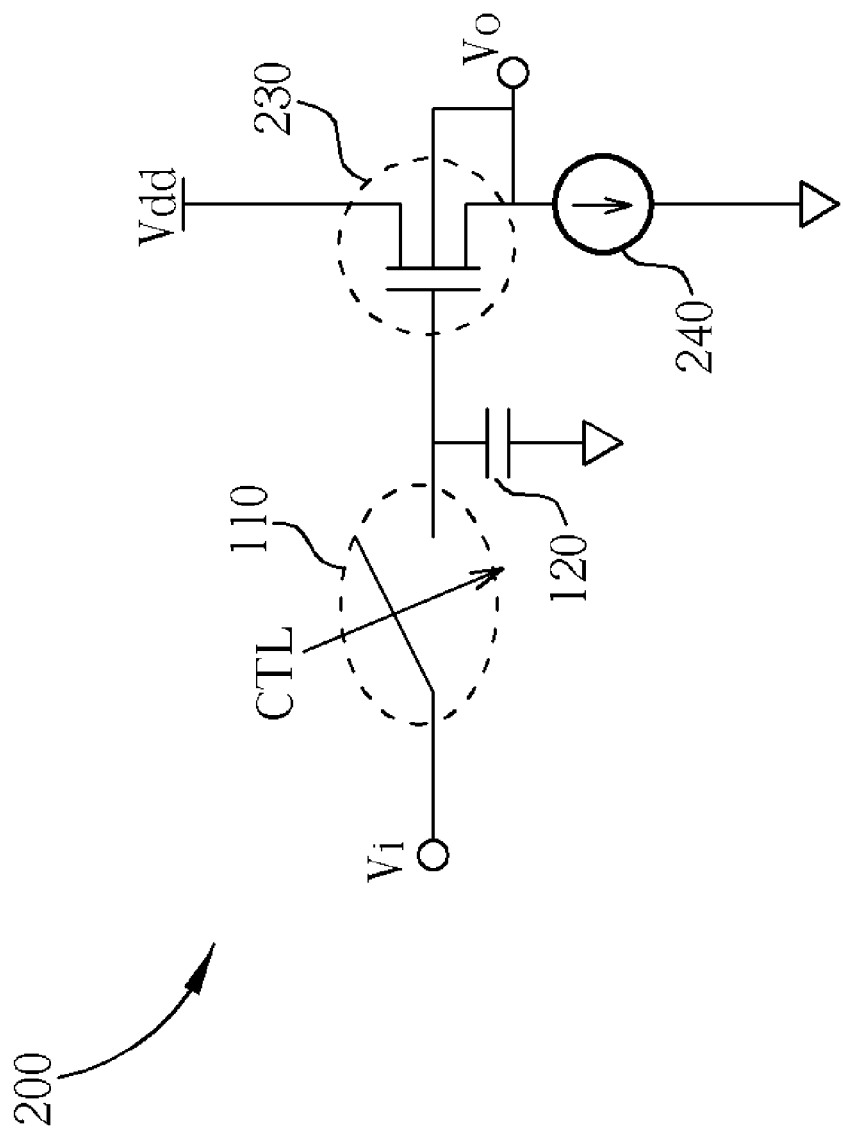
FIG. 2 shows a diagram of a track and hold circuit of another conventional open-loop scheme.
Figure 3:
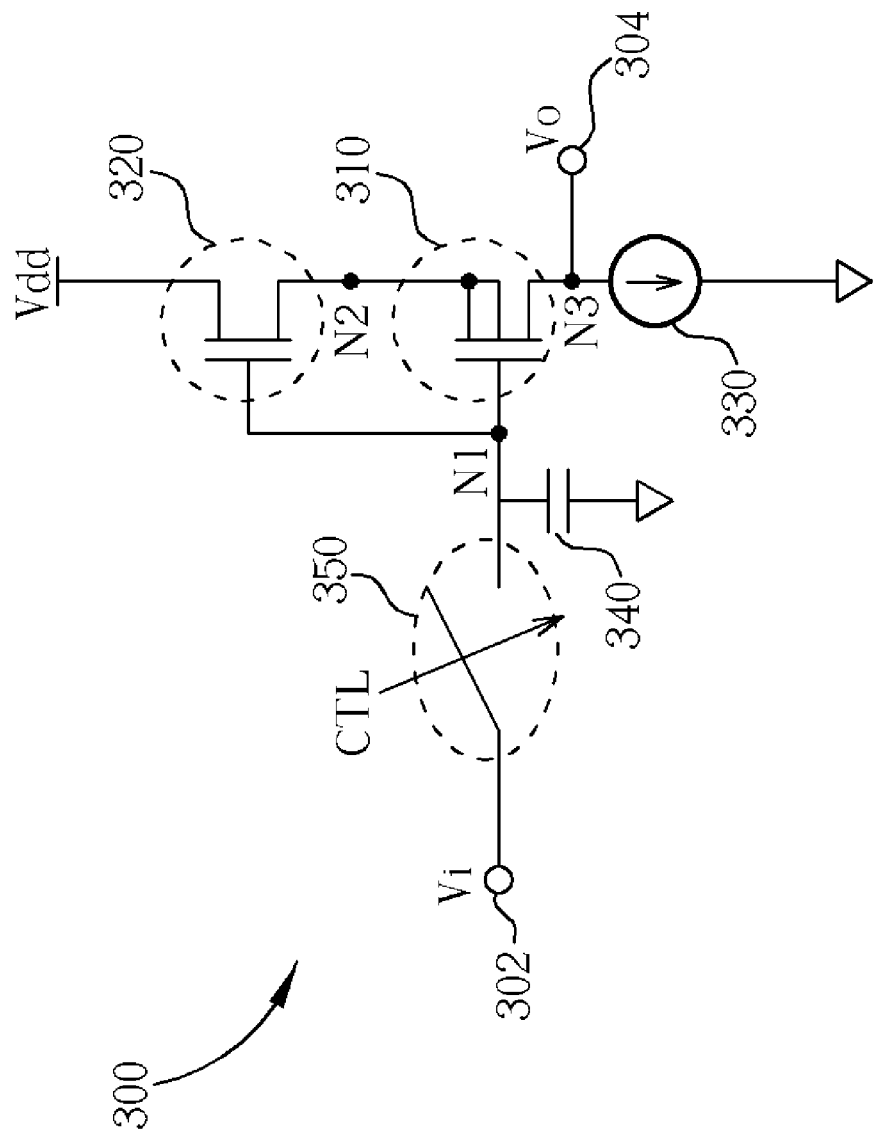
FIG. 3 shows a simplified diagram of a track and hold circuit according to a first embodiment of the present invention.

Please refer to FIG. 3. FIG. 3 shows a simplified diagram of a track and hold circuit 300 according to an embodiment of the present invention. The track and hold circuit 300 includes a first NMOS transistor 310 with a deep N well structure, a second NMOS transistor 320, a current source 330, a capacitive device 340, and a switch device 350, wherein the second NMOS transistor 320 is used as a source follower. As shown in FIG. 3, the first NMOS transistor 310 has a drain terminal coupled to its body terminal, and a source terminal coupled to the current source 330 and an output terminal 304. The second NMOS transistor 320 has a drain terminal coupled to a voltage supply Vdd, a gate terminal coupled to a gate terminal of the first NMOS transistor 310, and a source terminal coupled to the drain terminal of the first NMOS transistor 310. In other words, the first NMOS transistor 310 and the second NMOS transistor 320 are connected in cascode.

In the track and hold circuit 300, a threshold voltage of the second NMOS transistor 320 is designed to be lower than a threshold voltage of the first NMOS transistor 310, to ensure that the first NMOS transistor 310 operates in the saturation region. Taking a 90 nm process as an example, the threshold voltage of the second NMOS transistor 320 is preferably set to be lower than a threshold voltage of the first NMOS transistor 310 by about 100-150 mV. In a preferred embodiment, the second NMOS transistor 320 is implemented by a native NMOS transistor, which has a gate terminal threshold voltage of 0V.

As shown in FIG. 3, the capacitive device 340 has a terminal coupled to the gate terminal of the first NMOS transistor 310, and another terminal coupled to a fixed voltage level. As an example, the fixed voltage level is a ground level in this embodiment. The switch device 350 is coupled between an input terminal 302 and the gate terminal of the first NMOS transistor 310, and is used to selectively couple an input signal Vi to the gate terminal of the first NMOS transistor 310 according to the control of a control signal CTL. In practice, the capacitive device 340 can be a single capacitive unit, or a capacitive module implemented by a plurality of parallel-connected capacitors. In addition, the switch device 350 can be implemented as a transistor, and the control signal CTL can be a clock signal provided by a clock signal source.

Upon operation, the track and hold circuit 300 will switch between a track mode and a hold mode alternately. When the switch device 350 is turned on according to the control signal CTL, the track and hold circuit 300 will enter the track mode, and an output voltage Vo of the output terminal 304 will track the input voltage Vi of the input terminal 302. When the switch device 350 is turned off according to the control signal CTL, the track and hold circuit 300 will enter the hold mode, and charges stored in the capacitive device 340 will maintain the voltage of node N1 at Vi. After a settling time period elapses, the output voltage Vo will catch up with the input voltage Vi.

As mentioned above, the second NMOS transistor 320 in the track and hold circuit 300 is used as a source follower. Thus, the source terminal voltage of the second NMOS transistor 320 (i.e., the voltage at node N2, which is also the drain terminal voltage of the first NMOS transistor 310) will follow its gate terminal voltage (i.e., the voltage at node N1). On the other hand, since the source terminal voltage of the first NMOS transistor 310 will also follow its gate terminal voltage (i.e., the voltage at node N1), the voltage values at node N2 and node N3 will track each other. In this way, a cross voltage $V_{DS}$ between the drain terminal and the source terminal of the first NMOS transistor 310 will become fixed, and thus the linearity of the first NMOS transistor 310 will not be affected by the channel length modulation effect. In addition, since the body terminal and the drain terminal of the first NMOS transistor 310 are coupled together, the body effect of the first NMOS transistor 310 will not affect its linearity.

It is known from the above description, that the disclosed scheme of the track and hold circuit 300 can avoid the first NMOS transistor 310 from being affected by the channel length modulation effect and the body effect, and thus the linearity of the track and hold circuit 300 can be improved greatly.

In addition, since the body terminal of the first NMOS transistor 310 in this embodiment is a P well and the source terminal of the first NMOS transistor 310 is an N type doping area, a PN junction diode will be formed between the body terminal and the source terminal. When the switch device 350 is turned on, if the node N1 is at a high voltage level, and the voltage level at node N3 is low enough to turn on the diode, then the output voltage Vo of the output terminal 304 will track the input voltage Vi with a higher tracking speed. In other words, the above scheme can improve the response time of the track and hold circuit 300, or viewed from a different perspective, increase the bandwidth of the track and hold circuit 300. In addition, since the source terminal of the first NMOS transistor 310 is directly connected to the output terminal 304, the parasitic capacitance loading of the output terminal 304 can also be reduced.

On the other hand, since the required operating voltage of the track and hold circuit 300 is only limited by a sum of a cross voltage of the current source 330 and the cross voltage Vgs between the gate terminal and the source terminal of the first NMOS transistor 310, this track and hold circuit design is suitable for low voltage applications. It is known from the above description that the track and hold circuit 300 exhibits advantages of high speed, high linearity, and low power consumption at the same time.

Figure 4:
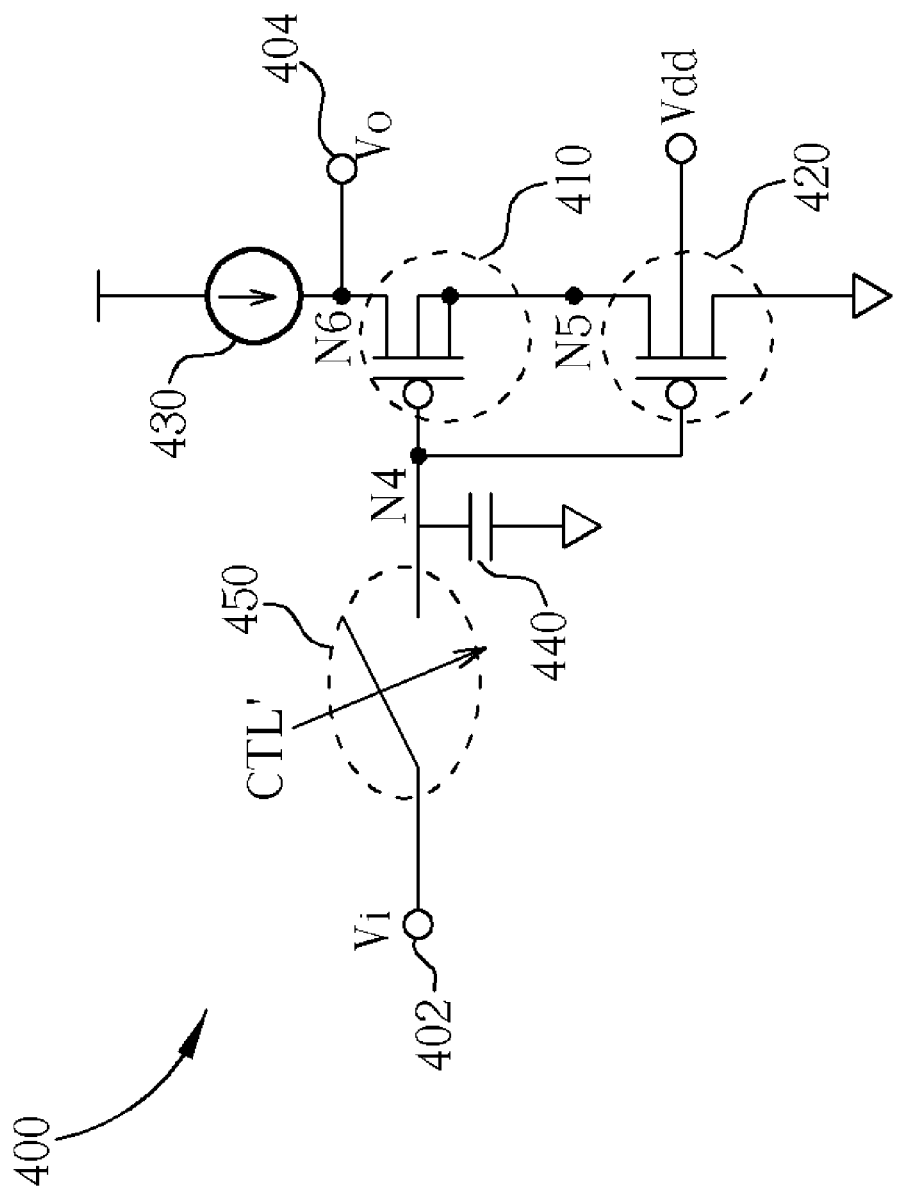
FIG. 4 shows a simplified diagram of a track and hold circuit according to a second embodiment of the present invention.

In practice, the transistors in the track and hold circuit also can be implemented with PMOS transistors. For example, FIG. 4 shows a simplified diagram of a track and hold circuit 400 according to another embodiment of the present invention. In this embodiment, the track and hold circuit 400 includes a first PMOS transistor 410 with an N well structure, a second PMOS transistor 420, a current source 430, a capacitive device 440, and a switch device 450, wherein the second PMOS transistor 420 is used as a source follower. As shown in FIG. 4, the first PMOS transistor 410 has a drain terminal coupled to its body terminal, and a source terminal coupled to the current source 430 and an output terminal 404. The second PMOS transistor 420 has a body terminal coupled to a voltage supply Vdd, a gate terminal coupled to a gate terminal of the first PMOS transistor 410, and a source terminal coupled to the drain terminal of the first PMOS transistor 410. In the track and hold circuit 400, the threshold voltage of the second PMOS transistor 420 is designed to be higher than that of the first PMOS transistor 410, so as to ensure that the first PMOS transistor 410 can operate in the saturation region. Taking a 90 nm process as an example, the threshold voltage of the second PMOS transistor 420 is preferably set to be higher than the threshold voltage of the first PMOS transistor 410 by about 100-150 mV. In practice, the second PMOS transistor 420 can be implemented with a native PMOS transistor.

In this embodiment, the capacitive device 440 has a terminal coupled to the gate terminal of the first PMOS transistor 410 and another terminal coupled to a fixed voltage level (such as a ground level). The switch device 450 is coupled between an input terminal 402 and the gate terminal of the first PMOS transistor 410, and is controlled by a control signal CTL'. Similar to the above embodiment, the switch device 450 is used to selectively couple an input signal Vi of the input terminal 402 to the gate terminal of the first PMOS transistor 410 according to the control signal CTL'.

Since the source terminal voltage of the second PMOS transistor 420 (i.e., the voltage at node N5, which is also the drain terminal voltage of the first PMOS transistor 410) will follow the voltage of the node N4, and the source terminal voltage of the first PMOS transistor 410 will also follow the node N4, the voltage values of the node N5 and the node N6 will track each other. Therefore, a cross voltage $V_{DS}$ between the drain terminal and the source terminal of the first PMOS transistor 410 will become fixed, and as a result the linearity of the first PMOS transistor 410 will not be affected by the channel length modulation effect. In addition, since the body terminal and the drain terminal of the first PMOS transistor 410 are coupled together, the body effect of the first PMOS transistor 410 will not affect its linearity. In comparison with the prior art, the linearity of the track and hold circuit 400 can be improved substantially.

In the embodiment shown in FIG. 4, since the source terminal of the first PMOS transistor 410 is a P type doping area and the body terminal of the first PMOS transistor 410 is an N well, a PN junction diode will subsequently be formed between the body terminal and the source terminal. In the track mode, if a cross voltage between node N6 and node N4 is higher than the required forward voltage for turning on the diode, then the diode will be turned on so that the output voltage Vo of the output terminal 404 will track the input voltage Vi at a higher tracking speed. In other words, the above scheme can increase the response speed of the track and hold circuit 400, or equivalently increase the bandwidth of the track and hold circuit 400. It is known from the above description that the above track and hold circuit 400 has the advantages of high speed and high linearity at the same time.

Those skilled in the art will readily observe that numerous modifications and alterations of the device and method may be made while retaining the teachings of the invention.

What is claimed is:

1. A track and hold circuit, comprising:
   a source follower having a drain terminal directly connected to a voltage supply;
   a MOS transistor, having a gate terminal directly connected to a gate terminal of the source follower, a drain terminal directly connected to both its body terminal and a source terminal of the source follower at all times, regardless of the operational state of the MOS transistor, and a source terminal directly connected to a current source and an output terminal;
   a capacitive device, having a terminal directly connected to the gate terminal of the MOS transistor and another terminal directly connected to a fixed voltage level; and
   a switch device, directly connected between an input signal and the gate terminal of the MOS transistor and controlled by a control signal.

2. The track and hold circuit of claim 1, wherein the source follower is a native MOS transistor.

3. The track and hold circuit of claim 1, wherein the MOS transistor is a first NMOS transistor with a well structure, and the well structure is a deep N well structure.

4. The track and hold circuit of claim 3, wherein the source follower is a second NMOS transistor, and a threshold voltage of the second NMOS transistor is lower than a threshold voltage of the first NMOS transistor.

5. The track and hold circuit of claim 4, wherein the second NMOS transistor is a native NMOS transistor.

6. The track and hold circuit of claim 4, wherein a difference between the threshold voltage of the second NMOS transistor and the threshold voltage of the first NMOS transistor achieves a predetermined value.

7. The track and hold circuit of claim 1, wherein the MOS transistor is a first PMOS transistor with a well structure, and the well structure is an N well structure.

8. The track and hold circuit of claim 7, wherein the source follower is a second PMOS transistor, and a threshold voltage of the second PMOS transistor is higher than a threshold voltage of the first PMOS transistor.

9. The track and hold circuit of claim 8, wherein the second PMOS transistor is a native PMOS transistor.

10. The track and hold circuit of claim 8, wherein a difference between the threshold voltage of the second PMOS transistor and the threshold voltage of the first PMOS transistor achieves a predetermined value.

11. The track and hold circuit of claim 1, wherein the control signal is a clock signal.

12. The track and hold circuit of claim 1, wherein the switch device is turned on in a track mode and turned off in a hold mode.

13. The track and hold circuit of claim 1, wherein the switch device is a transistor.

14. The track and hold circuit of claim 1, wherein the fixed voltage level is a ground level.

15. A track and hold circuit, comprising:
    a first NMOS transistor with a deep N well structure, having a drain terminal directly connected to its body terminal at all times, regardless of the operational state of the first NMOS transistor, and a source terminal directly connected to a current source and an output terminal;
    a second NMOS transistor, having a drain terminal directly connected to a voltage supply, a gate terminal directly connected to a gate terminal of the first NMOS transistor, and a source terminal directly connected to the drain terminal of the first NMOS transistor;
    a capacitive device, having a terminal directly connected to the gate terminal of the first NMOS transistor and another terminal directly connected to a fixed voltage level; and
    a switch device, directly connected between an input signal and the gate terminal of the first NMOS transistor and controlled by a control signal;
    wherein a threshold voltage of the second NMOS transistor is lower than a threshold voltage of the first NMOS transistor.

16. The track and hold circuit of claim 15, wherein the second NMOS transistor is a native NMOS transistor.

17. The track and hold circuit of claim 15, wherein a difference between the threshold voltage of the second NMOS transistor and the threshold voltage of the first NMOS transistor achieves a predetermined value.

18. A track and hold circuit, comprising:
    a first PMOS transistor with an N well structure, having a drain terminal coupled to its body terminal at all times, regardless of the operational state of the first PMOS transistor, and a source terminal directly connected to a current source and an output terminal;
    a second PMOS transistor, having a drain terminal directly connected to a voltage supply, a gate terminal coupled to a gate terminal of the first NMOS transistor, and a source terminal directly connected to the drain terminal of the first PMOS transistor;
    a capacitive device, having a terminal directly connected to the gate terminal of the first PMOS transistor and another terminal directly connected to a fixed voltage level; and
    a switch device, directly connected between an input signal and the gate terminal of the first PMOS transistor and controlled by a control signal;
    wherein a threshold voltage of the second PMOS transistor is higher than a threshold voltage of the first PMOS transistor.

19. The track and hold circuit of claim 18, wherein the second PMOS transistor is a native PMOS transistor.

20. The track and hold circuit of claim 18, wherein a difference between the threshold voltage of the second PMOS transistor and the threshold voltage of the first PMOS transistor achieves a predetermined value.

* * * * *